United States Patent
Tam et al.

(10) Patent No.: US 10,093,491 B2
(45) Date of Patent: Oct. 9, 2018

(54) WIRELESS SIGNAL TRANSMISSION IN A PICK-AND-PLACE APPARATUS

(71) Applicant: ASM Technology Singapore Pte Ltd, Singapore (SG)

(72) Inventors: Shing Wai Tam, Hong Kong (HK); Chak Tong Sze, Hong Kong (HK); Wing Sze Chan, Hong Kong (HK); Chuen Hong Lo, Hong Kong (HK); Sung Yeung, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/651,285

(22) Filed: Jul. 17, 2017

(65) Prior Publication Data

US 2018/0037421 A1    Feb. 8, 2018

Related U.S. Application Data

(60) Provisional application No. 62/369,825, filed on Aug. 2, 2016.

(51) Int. Cl.
*B25J 9/18* (2006.01)
*B65G 47/90* (2006.01)
(Continued)

(52) U.S. Cl.
CPC ...... *B65G 47/904* (2013.01); *H01L 21/67144* (2013.01); *H04W 4/005* (2013.01); *H04W 4/70* (2018.02)

(58) Field of Classification Search
CPC ........... B65G 47/904; H01L 21/67144; H04W 4/005; H04W 4/70
See application file for complete search history.

(56) References Cited

U.S. PATENT DOCUMENTS 6,300,644 B1* 10/2001 Beckhart ............... H01L 21/681
    250/559.33
2009/0070992 A1* 3/2009 Etter ..................... B25J 9/102
    29/741

(Continued)

FOREIGN PATENT DOCUMENTS

| CN | 102106062 A | 6/2011 |
|---|---|---|
| EP | 2130790 A1 | 12/2009 |
| TW | 200524249 A | 7/2005 |

OTHER PUBLICATIONS

Taiwan Office Action, dated Jun. 7, 2018, issued in corresponding Taiwan Patent Application No. 106123890. Total 4 pages.

*Primary Examiner* — Shawki S Ismail
*Assistant Examiner* — Zoheb Imtiaz
(74) *Attorney, Agent, or Firm* — Ostrolenk Faber LLP (57) ABSTRACT

A pick-and-place apparatus has a rotary turret and a plurality of pick arms arranged on the rotary turret for picking up and placing electronic devices during pick and place operations. A transmission stator and a transmission rotor are mounted on the rotary turret with an air gap between the transmission stator and the transmission rotor such that the transmission rotor is rotatable relative to the transmission stator. At least one motor for actuating at least one pick arm during the pick and place operations is operatively coupled to the transmission rotor. The transmission stator and the transmission rotor are configured to transmit data signals wirelessly across the air gap for driving the at least one motor to actuate the at least one pick arm.

17 Claims, 9 Drawing Sheets

(51) Int. Cl.
*H04W 4/00* (2018.01)
*H01L 21/67* (2006.01)
*H04W 4/70* (2018.01)

(56) References Cited

U.S. PATENT DOCUMENTS

| | | | |
|---|---|---|---|
| 2014/0348618 A1* | 11/2014 | Blank | B25J 9/043 414/217 |
| 2015/0147148 A1* | 5/2015 | Coady | H01L 21/68 414/744.2 |
| 2016/0181824 A1* | 6/2016 | Hui | H02J 50/12 307/104 |

* cited by examiner

WIRELESS SIGNAL TRANSMISSION IN A PICK-AND-PLACE APPARATUS

FIELD OF THE INVENTION

The invention relates to pick-and-place apparatus for picking and placing electronic devices, and in particular to the wireless communications, such as the transmission of electrical signals and/or power, in a pick-and-place apparatus.

BACKGROUND AND PRIOR ART

In the fast-paced evolution of light-emitting diode ("LED") package designs targeting cost reduction and reduced form factor, the development of chip-scale packages ("CSP"), which are flip-chip bonded LED die with exposed PN junctions at the bottom of the packages and light emission through a 5-sided silicon phosphor coating, is getting more popular.

Traditional LED device handlers need to pick up the LED units from a wafer frame, inspect, align, and then place these LED units onto a carrier tape. During such processes, it is necessary to avoid mechanical pressure on the LED unit causing deformation of the silicon phosphor, which would potentially affect its optical properties. It is also necessary to avoid placement of an LED unit onto an alignment module during orientation, which would risk scratching a bottom surface of the LED unit and damage the exposed PN junction. Thus, multiple pick arms on a turret with each pick arm having independent rotary capability is advantageous for correcting an angular alignment of the LED units without extraneous mechanical contact.

Existing designs adopt different approaches to avoid damage to the LED units. One approach is to use a slip ring module to transfer electrical signals and power to control multiple motor channels through physical conductive contact. However, there is an adverse effect of a shortened lifetime of the slip ring module due to friction during operation, and the slip ring module is also hard to replace. Another approach uses the engagement and disengagement of a motor with a gear to orientate an LED unit. After optical inspection to check the x, y, and theta positional shifts of an LED unit held on a pick arm, the turret arm would index to the next station that has a gear and a motor to engage the pick arm in order to correct the theta position of the LED unit. However, this approach can seriously slow down the machine's throughput.

It would be beneficial to introduce a wireless transmission system which helps to avoid the aforesaid shortcomings of the prior art approaches.

SUMMARY OF THE INVENTION

It is thus an object of the invention to seek to provide a wireless transmission system for a pick-and-place system which is suitable for wirelessly transmitting communications to an end-effector.

Accordingly, the invention provides a pick-and-place apparatus comprising: a rotary turret and a plurality of pick arms arranged on the rotary turret for picking up and placing electronic devices during pick and place operations; a transmission stator and a transmission rotor mounted on the rotary turret, and an air gap between the transmission stator and the transmission rotor such that the transmission rotor is rotatable relative to the transmission stator; and at least one motor for actuating at least one pick arm during the pick and place operations, the at least one motor and the at least one pick arm being operatively coupled to the transmission rotor; wherein the transmission stator and the transmission rotor are configured to transmit data signals wirelessly across the air gap for driving the at least one motor to actuate the at least one pick arm.

It would be convenient hereinafter to describe the invention in greater detail by reference to the accompanying drawings which illustrate a specific preferred embodiment of the invention. The particularity of the drawings and the related description is not to be understood as superseding the generality of the broad identification of the invention as defined by the claims.

BRIEF DESCRIPTION OF THE DRAWINGS

An example of a pick-and-place apparatus in accordance with the invention will now be described with reference to the accompanying drawings, in which.

DETAILED DESCRIPTION OF THE PREFERRED EMBODIMENT OF THE INVENTION

Figure 1:
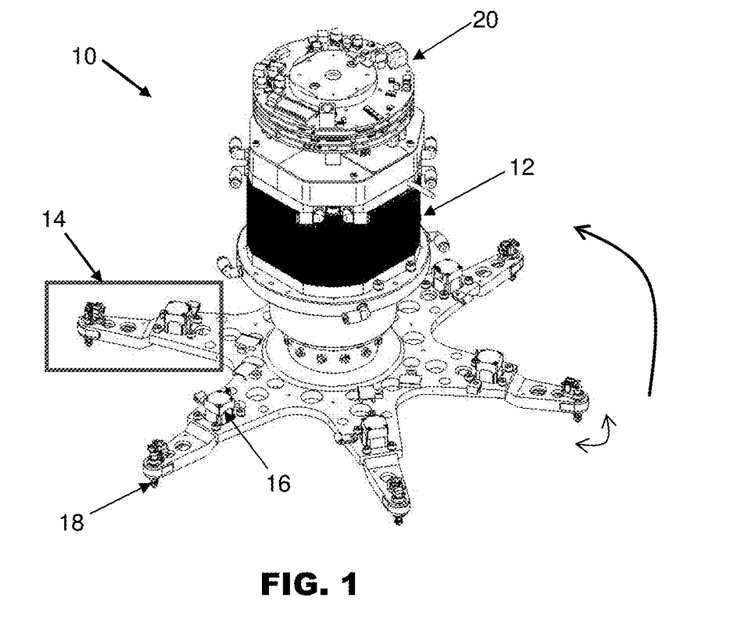
FIG. 1 is an isometric view of a turret motor assembly according to the preferred embodiment of the invention.

FIG. 1 is an isometric view of a pick-and-place apparatus in the form of a turret motor assembly 10 according to the preferred embodiment of the invention. The turret motor assembly 10 generally comprises a rotary turret and a rotary motor 12 that drives a plurality of pick arms 14 arranged on the rotary turret in a unidirectional rotary motion. The pick arms 14 are operative to pick up and place electronic devices during pick and place operations. In the illustrated embodiment, six rotary pick arms 14 are illustrated.

A motor, which may be in the form of a stepper motor 16, and a pick arm collet 18 are mounted on each pick arm 14. The pick arm collet 18 is located at a distal end of the pick arm 14 and is adapted to hold and position an electronic device to various processing stations located along a rotary path of the pick arm collet 18. Each stepper motor 16 is operative to actuate a corresponding pick arm 14. In particular, each stepper motor 16 drives the pick arm collet 18 on the pick arm 14 to rotate so as to adjust an orientation of the electronic device that it is holding.

A wireless transmission module 20 is mounted on top of the rotary motor 12 of the rotary turret, and is configured to transmit electrical and data signals wirelessly to the stepper motors 16. Wireless transmission of electrical and data signals allows the rotary pick arms 14 to rotate unidirectionally without the limitations that are faced by the use of physical cables and wires, such as unwanted entanglement.

Figure 2:
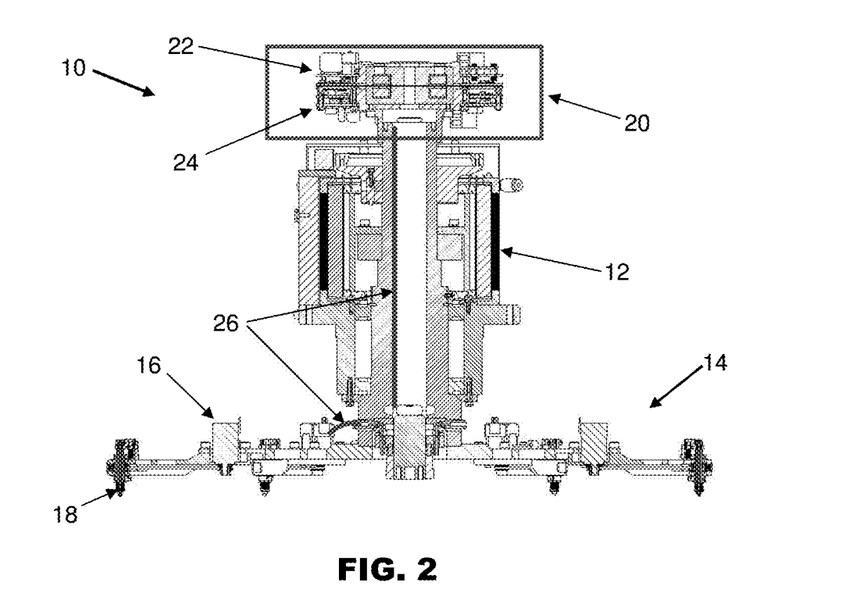
FIG. 2 is a cross-sectional side view of the turret motor assembly of FIG. 1.

FIG. 2 is a cross-sectional side view of the turret motor assembly 10 of FIG. 1. In particular, a signal transmission path of the turret motor assembly 10 is illustrated. The wireless transmission module 20 includes a transmission stator 22 and a transmission rotor 24, the transmission rotor 24 being configured to be rotatable relative to the transmission stator 22. The stepper motors 16 and rotary pick arms 14 are operatively coupled to the transmission rotor 24 so as to be rotatable together with the transmission rotor 24. Power and data signals are first input into the transmission stator 22, and the same are received wirelessly by the transmission rotor 24. In turn, the transmission rotor 24 is electrically connected to the respective stepper motors 16 by transmission cables 26, which transmit the said power and data signals to the stepper motors 16 for driving the stepper motors 16. By driving the stepper motors 16, the pick arm collets 18 at the end of the respective pick arms 14 can be actuated to rotate so as to adjust the orientations of the electronic devices that are held by the pick arm collets 18.

Figure 3A:
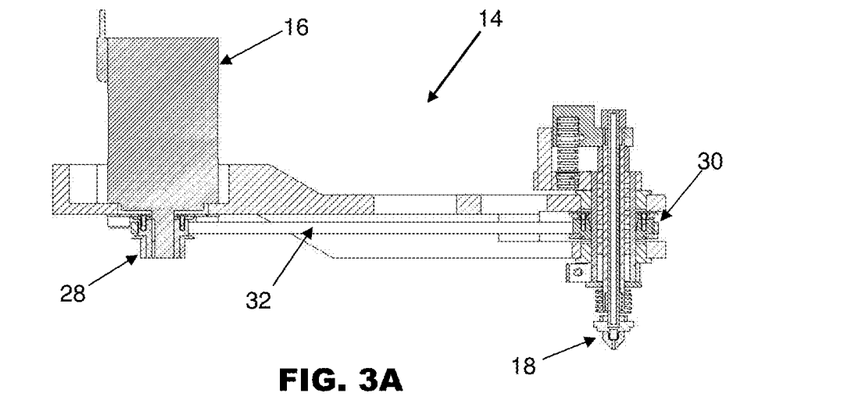
FIGS. 3A and 3B are side and isometric views respectively of a pick-arm assembly comprised in the turret motor assembly of FIG. 1.
Figure 3B:
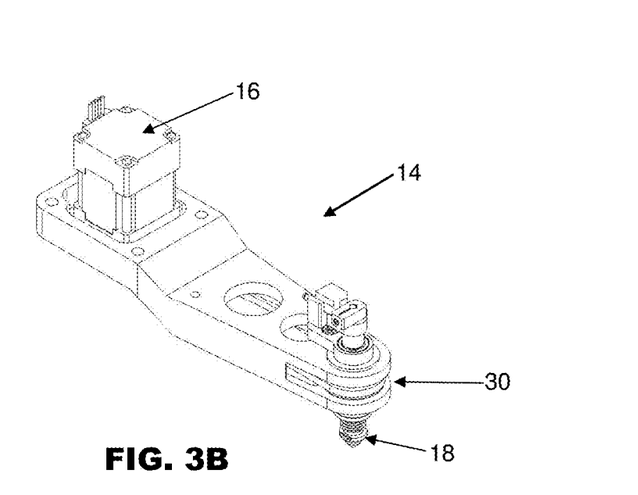

FIGS. 3A and 3B are side and isometric views respectively of a pick-arm assembly comprised in the turret motor assembly 10 of FIG. 1. A stepper motor pulley 28 is attached to the stepper motor 16 and a collet pulley 30 is attached to the pick arm collet 18. A timing belt 32 operatively connects the stepper motor pulley 28 and the collet pulley 30. When the stepper motor pulley 28 rotates in tandem with the stepper motor 16, it drives the timing belt 32 to move and to drive the collet pulley 30 to rotate, thereby rotating the pick arm collet 18 accordingly.

Figure 4:
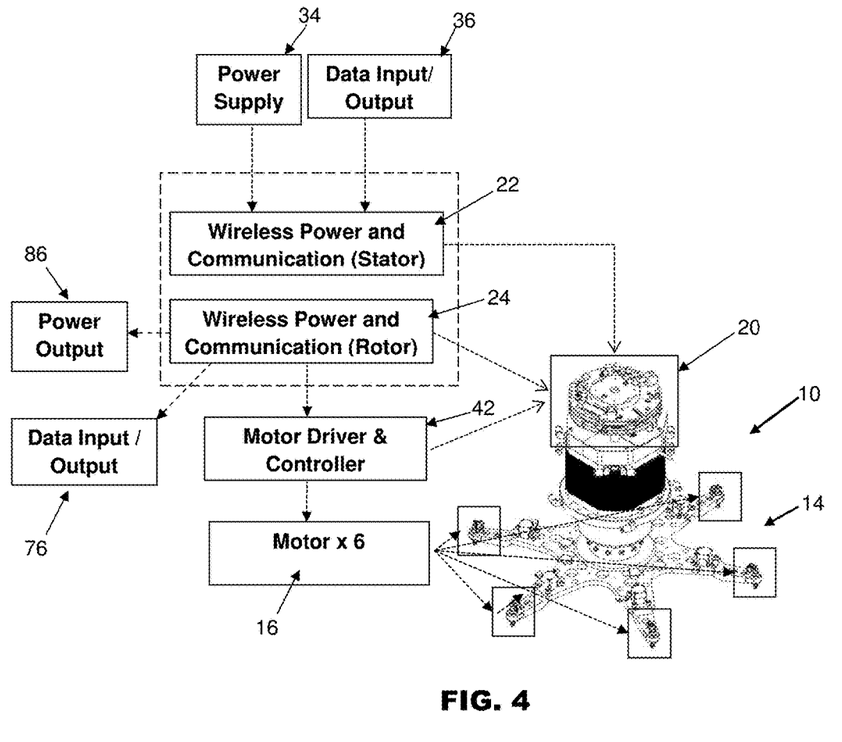
FIG. 4 illustrates the main portions of the turret motor assembly comprising a wireless transmission system.

FIG. 4 illustrates the main portions of the turret motor assembly 10 comprising the wireless transmission system. The wireless transmission module 20 has a power supply in the form of a power converter 34, and a data input/output module 36 that receives power and signal inputs respectively from external sources (not shown). Such power and signal inputs are first received by the transmission stator 22, which then wirelessly transmits the same to the transmission rotor 24. There is a stepper driver and controller 42 located in the transmission rotor 24, which serves to drive and control the plurality of stepper motors 16.

Figure 5:
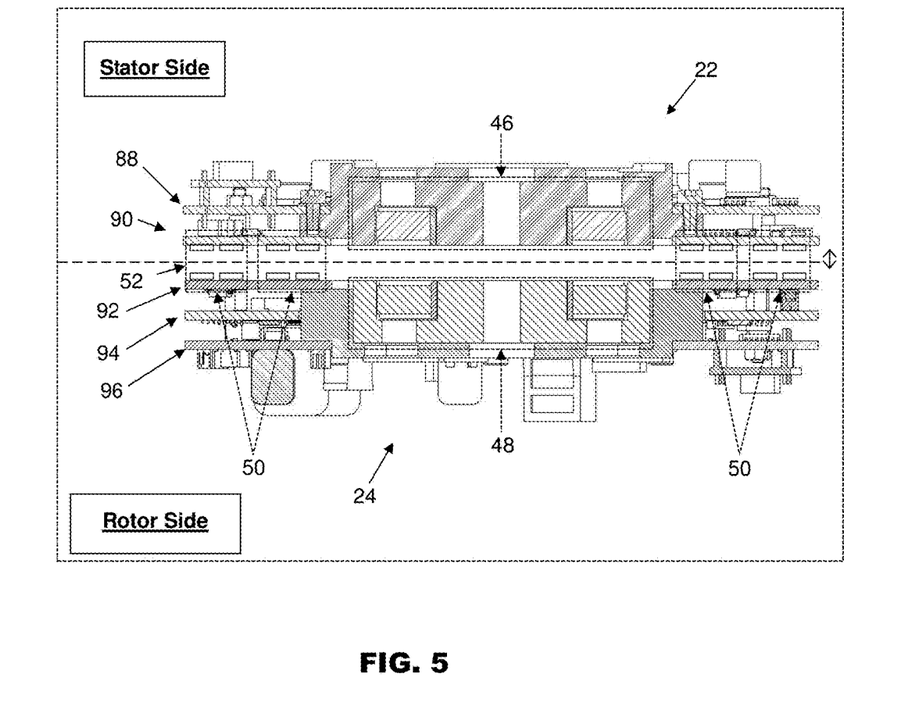
FIG. 5 is a side view of the wireless transmission module in accordance with the preferred embodiment of the invention.

FIG. 5 is a side view of the wireless transmission module 20 in accordance with the preferred embodiment of the invention. The transmission stator 22 includes a stator-side transformer 46 and the transmission rotor 24 includes a rotor-side transformer 48, the respective transformer 46, 48 being configured to transmit electrical power through an air gap 52 between the transmission stator 22 and the transmission rotor 24. Capacitors, which may be in the form of air capacitors 50, are also respectively located on both the transmission stator 22 and the transmission rotor 24 for transmitting data wirelessly across the air gap 52.

A key element for the aforesaid wireless power and signal communication has two main parts, comprising the transformers 46, 48 and the air capacitors 50 respectively. Each transformer 46, 48 is configured such that it may have a power transfer capacity of up to 50 W.

The air capacitors 50 are used for electrical signal communication. Differential capacitive coupling is used to form a go-and-return path. Two pairs of differential capacitive coupling paths are used for full-duplex communications. A low impedance differential input receiver is used for common mode noise rejection and for enhancing signal integrity. The capacitive coupling path also acts as an isolation barrier between the transmission stator 22 and the transmission rotor 24, which further improves the isolation of signals from ambient common mode noise (such as motor noise).

The air gap 52 between the stator side and the rotor side is designed at a separation distance of about 0.65 mm, so that a closed-loop electromagnetic coupling path can be ensured. In addition, it ensures that electrical energy can be coupled to the rotor core successfully with a maximum operational voltage of 48V.

Figure 6:
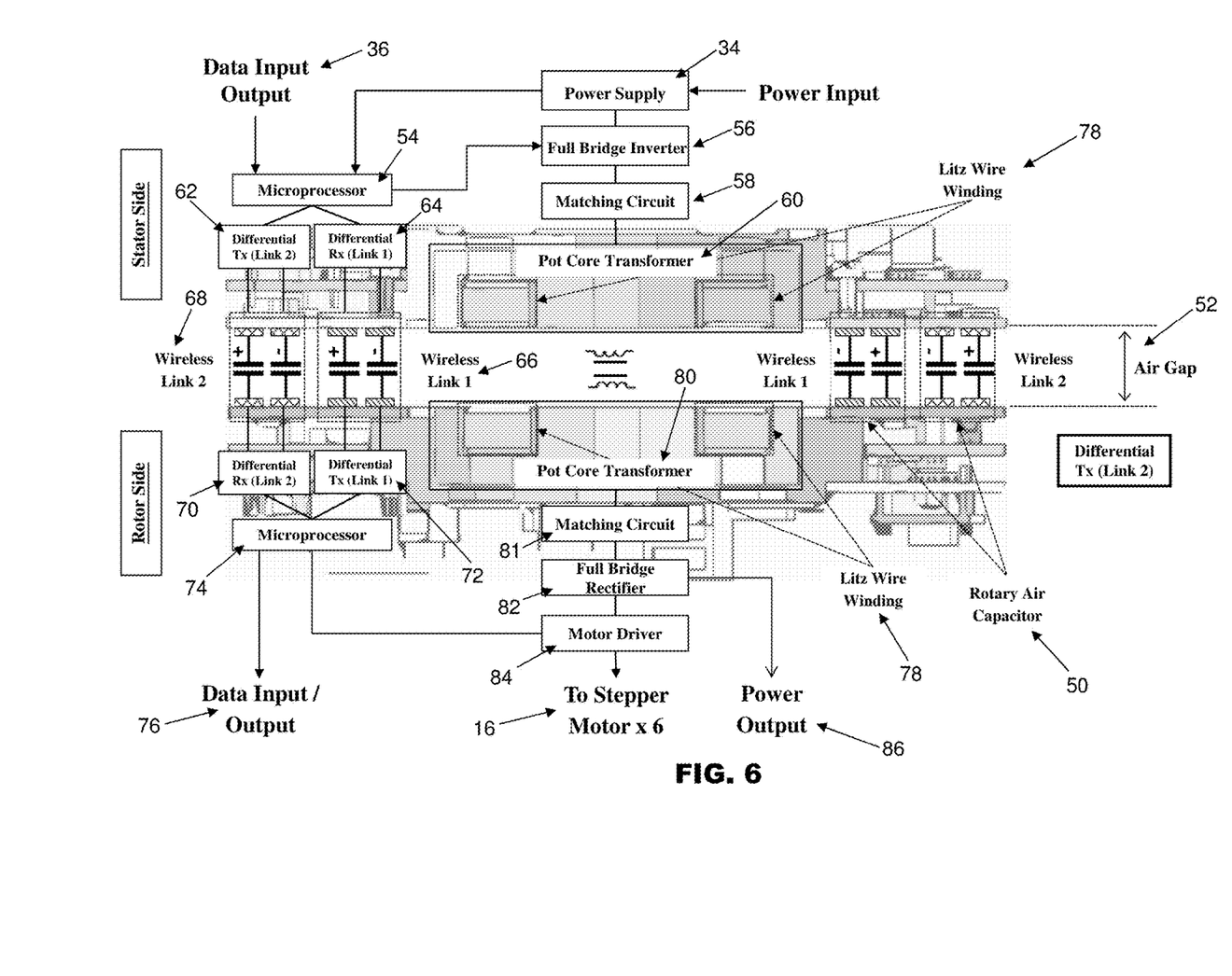
FIG. 6 is a functional diagram highlighting the main portions of the wireless transmission module.

FIG. 6 is a functional diagram highlighting the main portions of the wireless transmission module 20. Power is input to the power converter 34, and then to a full bridge inverter 56. A matching circuit 58 is adapted to then convey power to a circular ferrite pot core transformer 60 comprised in the stator-side transformer 46, the matching circuit 58 being configured to maximize the efficiency of power transfer.

Each transformer 46, 48 is formed by a circular ferrite pot core transformer 60, 80. The coil winding method is optimized using Litz wire windings to minimize alternating current ("AC") resistance due to a proximity effect, and to maximize leakage inductance for low operation resonance frequency, which also allows lower AC resistance due to its operation at a low frequency. A resonance mode is used with additional capacitors to enhance power transfer efficiency and also produces low EMI noise. Moreover, it is preferred that the concentricity between the two cores is controlled to within +/−0.5 mm, in order to maximize energy transfer efficiency of the wireless transmission system.

Separately, the data input/output module 36 is connected to a microprocessor 54 which provides command signals to a signal transmitter in the form of a differential transmitter 62 as well as the full bridge inverter 56. Besides sending data signals through the differential transmitter 62, the microprocessor 54 also receives data feedback signals from a differential receiver 64. There are a series of wireless links 66, 68 comprised in the air capacitors 50 for sending data signals wirelessly through the air gap 52. The wireless links 66, 68 are coupled to the differential transmitter 62 and differential receiver 64. Correspondingly, Litz wire windings 78 which comprise primary wire windings located in the stator-side ferrite pot core transformer 60 and secondary wire windings located in the rotor-side ferrite pot core transformer 80 cooperate to produce electromagnetic interaction which cause power generation through the air gap 52 as a result of magnetic flux lines created through the ferrite pot core transformers 60, 80.

On the transmission rotor 24, signal receivers in the form of differential receivers 70, and signal transmitters in the form of differential transmitters 72, are configured to receive and transmit data signals from and to the differential transmitters 62 and differential receivers 64 respectively. Such data signals are sent to another microprocessor 74 which generates separate data input/output 76 that can be used as feedback signals by the microprocessor 54 in the transmission stator 22. Other data that are wirelessly received/transmitted can be used for other electrical components mounted on the turret motor assembly 10 that require them, such as a position encoder.

In the ferrite pot core transformer 80 of the transmission rotor 24, an electrical current is produced via the Litz wire windings 78. The electrical current is fed to a matching circuit 81 as well as a full bridge rectifier 82 connected to a motor driver 84. The motor driver 84 is operative to drive and control the plurality of stepper motors 16 in accordance with data input signals received from the differential receiver 70. Excess power output 86 that is not used for the stepper motors 16 can be used for other electrical components mounted on the turret motor assembly 10 that require it, such as inspection cameras (not shown).

Figure 7:
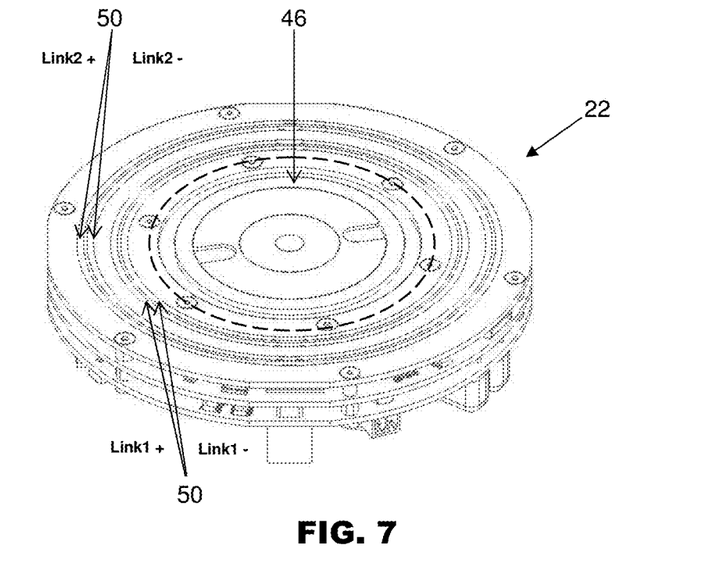
FIG. 7 is an isometric view of only a stator side of the wireless transmission module.

FIG. 7 is an isometric view of only the transmission stator 22 which is located on the stator side of the wireless transmission module 20. It shows that the stator-side transformer 46 and air capacitors 50 are concentrically arranged on the transmission stator 22 for transmitting power and data signals respectively. The air capacitors 50 include two pairs of differential capacitive coupling paths in the form of metallic rings that are spaced from each other for full-duplex communications, thus enhancing common mode noise immunity.

Figure 8:
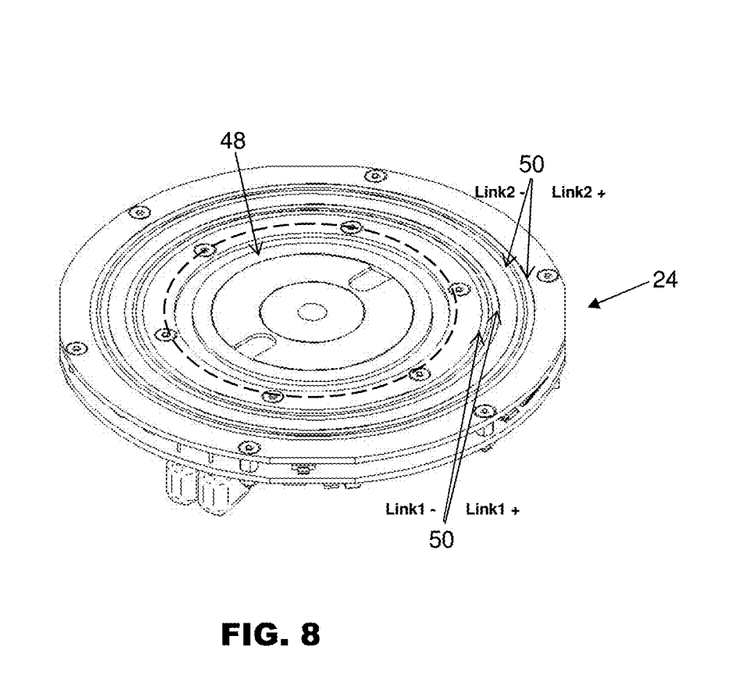
FIG. 8 is an isometric view of only a rotor side of the wireless transmission module.

FIG. 8 is an isometric view of only the transmission rotor 24 which is located on the rotor side of the wireless transmission module 20. It similarly shows that the rotor-side transformer 48 and air capacitors 50 are concentrically arranged on the transmission rotor 24 for receiving power and data signals respectively. The two pairs of differential capacity coupling paths of the air capacitors 50 on the transmission rotor 24 mirror those that are arranged on the transmission stator 22.

Figure 9:
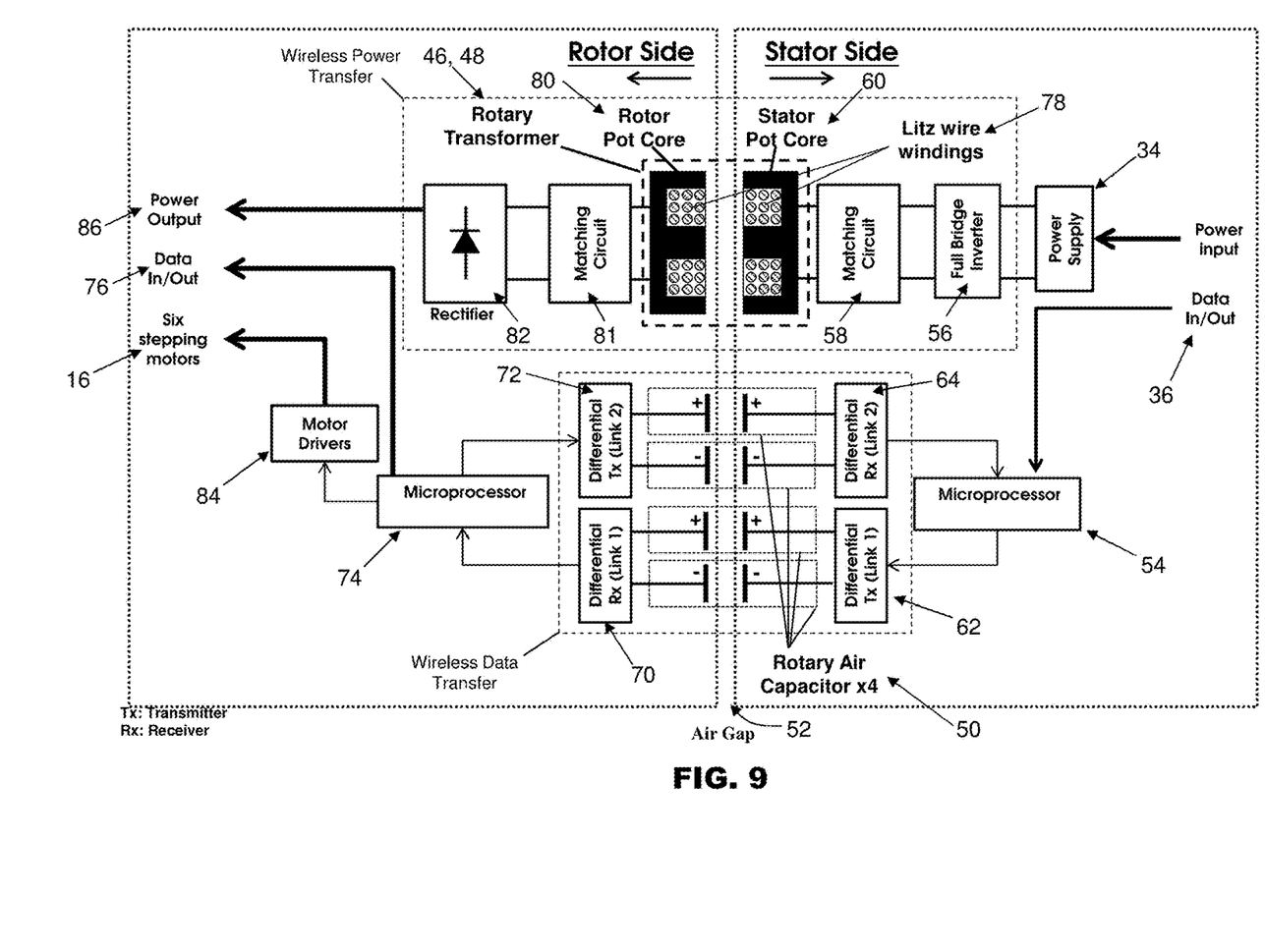
FIG. 9 is a functional block diagram illustrating respective power and signal transmission portions of the wireless transmission module.

FIG. 9 is a functional block diagram illustrating respective power and signal transmission portions of the wireless transmission module 20. In this view, the transmission stator 22 and the transmission rotor 24 have been rotated clockwise with respect to the preceding illustrations for showing the respective transmission portions. In respect of power, the power input is conveyed by the power converter 34 to the full bridge inverter 56 and the matching circuit 58. The stator-side pot core transformer 60 and the rotor-side pot core transformer 80 are separated by the air gap 52. Litz wire windings 78 installed in the respective pot core transformers 60, 80 allow power to be generated in the rotor-side pot core transformer 80, which is then transmitted to the matching circuit 81 and the full bridge rectifier 82 on the transmission rotor 24. The power output 86 is conducted via the transmission cables 26 to power the stepper motors 16 and other electrical components that need to be electrically powered.

In respect of data signals, the data input/output module 36 is connected to the microprocessor 54 which sends data commands to the differential transmitter 62 and receives data from the differential receiver 64. The differential transmitter 62 and differential receiver 64 are coupled to wireless links comprised in the air capacitors 50 for sending signals wirelessly through the air gap 52. The differential receiver 70 and differential transmitter 72 on the transmission rotor 24 receives data from the differential transmitter 62 and sends data to the differential receiver 64 on the transmission stator 22 respectively.

The microprocessor 74 processes the data and serves to send commands to the motor drivers 84 to drive the stepper motors 16, and is also configured to provide data input/output 76 that can be used as feedback by the microprocessor 54 of the transmission stator 22.

Figure 10:
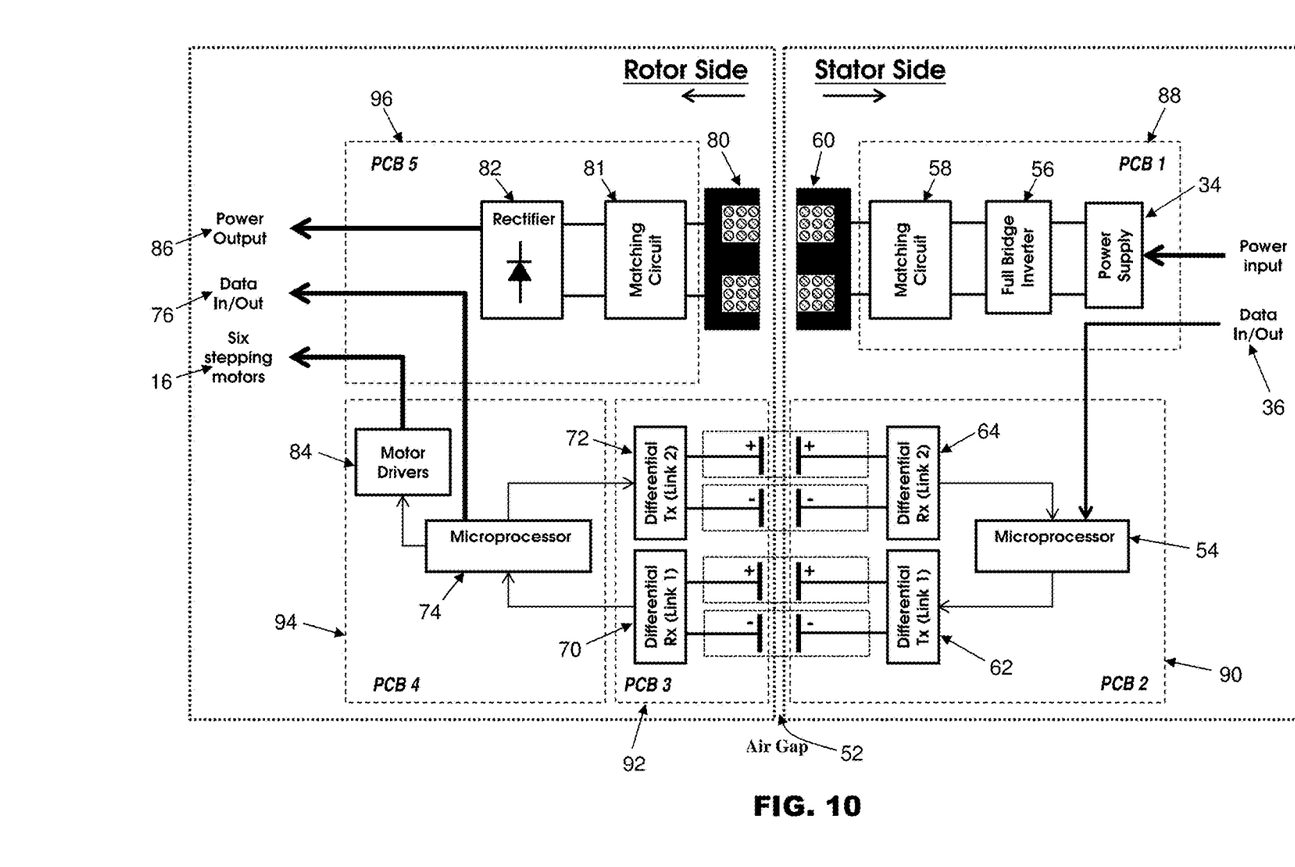
FIG. 10 is functional block diagram illustrating the functions of the printed circuit boards comprised in the wireless transmission module.

FIG. 10 is functional block diagram illustrating the functions of a plurality of printed circuit boards 88, 90, 92, 94, 96 comprised in the wireless transmission module 20. As shown in FIG. 10, a first printed circuit board 88 comprising the power converter 34, full bridge inverter 56 and the matching circuit 58, and a second printed circuit board 90 comprising the microprocessor 54, differential transmitter 62 and differential receiver 64, are mounted on the transmission stator 22.

A third printed circuit board 92 comprising the differential receiver 70 and differential transmitter 72, and a fourth printed circuit board 94 comprising the microprocessor 74 and motor drivers 84, are mounted on the transmission rotor 24. In addition, a fifth printed circuit board 96 comprising the matching circuit 81 and full bridge rectifier 82 is also mounted on the transmission rotor 24. This arrangement of a plurality of printed circuit boards 88, 90, 92, 94, 96 in a layered configuration facilitates a more compact and neat design for the wireless transmission module 20 whilst being able to house a plurality of operational components.

Figure 11:
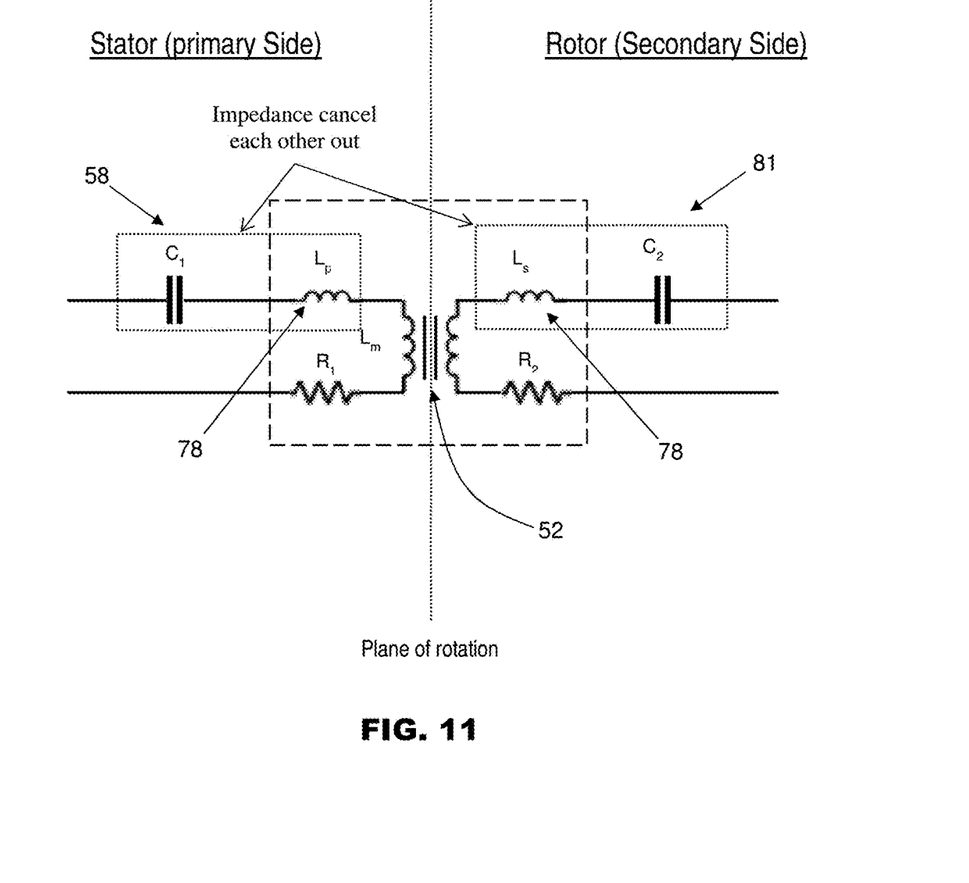
FIG. 11 is a circuit diagram illustrating a matching circuit that is usable with the preferred embodiment of the invention.

FIG. 11 is a circuit diagram illustrating a matching circuit that is usable with the preferred embodiment of the invention. The matching circuit diagram is illustrated with a stator-side matching circuit 58 and a rotor-side matching circuit 81, and an air gap 52 separating them. The matched transformer is driven by the full-bridge inverter 56.

Each matching circuit 58, 81 includes a capacitor $C_1$, $C_2$ that is connected in series to the respective Litz wire windings 78. Such series-series matching topology is chosen in order to improve coupling efficiency. Each set of Litz wire windings 78 has a leakage inductance, being $L_p$ on the primary side, and $L_s$ on the secondary side. The Litz wire windings 78 have a DC and an AC resistance, being $R_1$ on the primary side, and $R_2$ on the secondary side.

In order to increase the leakage inductance $L_p$, $L_s$ in the Litz wire windings 78, the Litz wire windings are deliberately wound with half-turns rather than full-turns. When the matched transformer is operated at a frequency $f_{res}$, the impedance of leakage inductance is cancelled by the impedance in the capacitors $C_1$, $C_2$, such that $L_pC_1=L_sC_2$. In other words, the full-bridge inverter 56 drives an ideal transformer with a magnetizing inductance of $L_m$. The coupling coefficient is insensitive to the air gap 52. Even when the air gap 52 varies due to vibration or misalignment from assembly, which might introduce output voltage variations on the transmission rotor 24, such topology helps to reduce output voltage variations after rectification by the full-bridge rectifier 82 which is coupled to the rotor-side matching circuit 81.

The operational frequency of the transformer is preferably designed to within 30-60 kHz to enhance power transfer efficiency, at low electromagnetic radiation with no audible noise.

It should thus be appreciated that the rotary turret assembly 10 according to the preferred embodiment of the invention utilizes a transformer 46, 48 and air capacitors 50 respectively with associated hardware to produce wireless transmission of power and electrical signals to and from the stepper motors 16 and motor drivers 84 to independently control multiple pick arm collets 18. Since it is important in the LED industry to inspect and correct the positions of LED units before placing them onto carrier tapes for downstream processes, such wireless transmission of power and data signals enables a rotary turret assembly 10 having multiple pick arms 14 to rotate in a unidirectional manner to achieve multiple-station parallel processing capability.

Moreover, it should be appreciated that the wireless transmission design in accordance with the preferred embodiment of the invention avoids the risk of cable twist or cable breakage, and also prolongs the useful lifetime of the wireless transmission module 20. Angular adjustment of LED units may be performed in real time during turret indexing so that optimal machine throughput and precise placement to a carrier tape can be accomplished.

The invention described herein is susceptible to variations, modifications and/or additions other than those specifically described and it is to be understood that the invention includes all such variations, modifications and/or additions which fall within the spirit and scope of the above description.

The invention claimed is:

1. A pick-and-place apparatus comprising:
   a rotary turret and a plurality of pick arms arranged on the rotary turret for picking up and placing electronic devices during pick and place operations;
   a transmission stator and a transmission rotor mounted on the rotary turret, and an air gap between the transmission stator and the transmission rotor such that the transmission rotor is rotatable relative to the transmission stator; and
   at least one motor for actuating at least one pick arm during the pick and place operations, the at least one motor and the at least one pick arm being operatively coupled to the transmission rotor;
   wherein the transmission stator and the transmission rotor are configured to transmit data signals wirelessly across the air gap for driving the at least one motor to actuate the at least one pick arm.

2. The pick-and-place apparatus as claimed in claim 1, wherein the at least one motor comprises a stepper motor, and each pick arm is actuated by a single stepper motor.

3. The pick-and-place apparatus as claimed in claim 1, further comprising a pick arm collet mounted on each pick arm for holding and positioning the electronic devices, wherein the motor is operative to actuate the pick arm collet to rotate with respect to the pick arm so as to adjust an orientation of the electronic device that is held by the pick arm collet.

4. The pick-and-place apparatus as claimed in claim 3, further comprising a timing belt operatively connecting the motor and the pick arm collet for actuating rotation of the pick arm collet by the motor.

5. The pick-and-place apparatus as claimed in claim 1, wherein the at least one motor and the at least one pick arm are configured to rotate together with the transmission rotor.

6. The pick-and-place apparatus as claimed in claim 1, further comprising a transmission cable connecting the at least one motor and the transmission rotor, for transmitting the data signals between the transmission rotor and the motor.

7. The pick-and-place apparatus as claimed in claim 1, further comprising air capacitors respectively located on the transmission stator and the transmission rotor for transmitting data wirelessly across the air gap.

8. The pick-and-place apparatus as claimed in claim 7, wherein the air capacitors are coupled using two pairs of differential capacitive coupling paths in the form of metallic rings that are spaced from each other for full-duplex communications.

9. The pick-and-place apparatus as claimed in claim 7, further comprising a data input/output module and a microprocessor connected to the transmission stator which provide and receive command signals to and from the air capacitors.

10. The pick-and-place apparatus as claimed in claim 9, further comprising a differential receiver and a differential transmitter coupled between the microprocessor and the air capacitors.

11. The pick-and-place apparatus as claimed in claim 7, further comprising:
    a microprocessor connected to the transmission rotor, which provides and receives command signals to and from the air capacitors; and
    a differential receiver and a differential transmitter coupled between the microprocessor and the air capacitors.

12. The pick-and-place apparatus as claimed in claim 11, wherein the microprocessor is operative to send commands to the at least one motor to drive the motor, and to provide data output sent to the transmission stator to be used as feedback.

13. The pick-and-place apparatus as claimed in claim 1, further comprising a power supply connected to the transmission stator for supplying electrical power to the at least one motor across the air gap.

14. The pick-and-place apparatus as claimed in claim 13, wherein the transmission stator further comprises a stator-side transformer and the transmission rotor further comprises a rotor-side transformer, and wherein the stator-side transformer and the rotor-side transformer are configured to transmit electrical power across the air gap through electromagnetic interaction.

15. The pick-and-place apparatus as claimed in claim 14, wherein the stator-side transformer and the rotor-side transformer each comprises a circular ferrite pot core transformer having Litz wire windings.

16. The pick-and-place apparatus as claimed in claim 14, further comprising a stator-side matching circuit associated with the transmission stator and a rotor-side matching circuit associated with the transmission rotor, the combination of matching circuits being operative to reduce output voltage variations in the electrical power transmitted across the air gap.

17. The pick-and-place apparatus as claimed in claim 16, further comprising a full-bridge rectifier coupled to the rotor-side matching circuit.

* * * * *